United States Patent [19]
Yoshimi et al.

[11] Patent Number: 6,091,632
[45] Date of Patent: *Jul. 18, 2000

[54] NONVOLATILE SEMICONDUCTOR STORAGE DEVICE HAVING A PLURALITY OF BLOCKS OF MEMORY CELL TRANSISTORS FORMED ON RESPECTIVE WELLS ISOLATED FROM EACH OTHER

[75] Inventors: Masanori Yoshimi; Shinichi Sato, both of Fukuyama, Japan

[73] Assignee: Sharp Kabushiki Kaisha, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/066,514

[22] Filed: Apr. 24, 1998

[30] Foreign Application Priority Data

Jun. 13, 1997 [JP] Japan ................................. 9-156273

[51] Int. Cl.[7] ................................................. G11C 16/04
[52] U.S. Cl. ................................. 365/185.11; 365/185.27
[58] Field of Search .......................... 365/185.11, 185.18, 365/185.27, 230.03

[56] References Cited

U.S. PATENT DOCUMENTS 5,509,018 4/1996 Niijima et al. ................. 365/185.09 X
5,822,248 10/1998 Satori et al. ..................... 365/185.11 X
5,847,995 12/1998 Kobayashi et al. ............ 365/185.11 X Primary Examiner—A. Zarabian
Attorney, Agent, or Firm—Morrison & Foerster LLP

[57] ABSTRACT

A plurality of blocks of memory cell transistors are formed on the respective isolated wells. In a write stage, a predetermined write-stage well voltage is applied to the well of a selected block including the memory cell transistors to be subjected to a write operation, a bias voltage is applied to the well of each of the remaining, non-selected blocks to increase a threshold voltage of the memory cell transistors of each non-selected block, in comparison with a threshold voltage determined by the predetermined write-stage well voltage, and a voltage is applied to the control gates of the memory cell transistors of each non-selected block to reduce a difference between a potential of the floating gate of each memory cell transistor of each non-selected block and a write-stage drain voltage applied to the drain of the memory cell transistor through the associated bit line such that a source-drain leak current of each memory cell transistor in the non-selected blocks falls in a permissible range.

4 Claims, 5 Drawing Sheets

NONVOLATILE SEMICONDUCTOR STORAGE DEVICE HAVING A PLURALITY OF BLOCKS OF MEMORY CELL TRANSISTORS FORMED ON RESPECTIVE WELLS ISOLATED FROM EACH OTHER

BACKGROUND OF THE INVENTION

The present invention relates to a nonvolatile semiconductor storage device, and in particular, to a nonvolatile semiconductor storage device (flash memory) constructed such that an erase operation is executed block by block.

FIG. 1 is a circuit diagram of a prior art nonvolatile semiconductor storage device of the above type, and FIG. 2 is a sectional view showing the construction of one of memory cell transistors constituting the nonvolatile semiconductor storage device. In FIG. 2, reference numeral 21 denotes a p-type Si substrate, reference numerals 22 and 23 denote a source and a drain, respectively, both constructed of an n-type impurity diffusion layer, reference numeral 24 denotes a floating gate, and reference numeral 25 denotes a control gate.

Erase, write and read operations of the memory cell transistor will be described next.

ERASE OPERATION (WRITE OPERATION OF INITIAL VALUE DATA 0)

This operation is executed by applying a specified negative voltage (−9 V, for example) to the source 22 and the substrate 21 of the memory cell transistor (with the drain 23 being in a floating state) and a specified positive voltage (10 V, for example) to the control gate 25 to thereby form a high electric field directed from the floating gate 24 to the source 22 so that electrons are injected into the floating gate 24 by an FN (Fowler-Nordheim) current to finally achieve a threshold voltage of a specified value or higher (3 V or higher, for example) of the memory cell transistor.

WRITE OPERATION OF DATA 1

This operation is executed by applying a specified positive voltage (5 V, for example) to the drain 23 of the memory cell transistor, grounding the substrate 21 (with the source 22 being in a floating state) and applying a specified negative voltage (−9 , for example) to the control gate 25 to thereby form a high electric field directed from the drain 23 to the floating gate 24 so that electrons are extracted from the floating gate 24 to the drain 23 by means of the FN current to finally reduce the threshold value of the memory cell transistor to a specified value (1.5 V, for example).

WRITE OPERATION OF DATA 0

When writing data 0, the voltage to be applied to the drain 23 is set to the ground potential. In this case, the electric field between the floating gate 24 and the drain 23 becomes a low electric field, so that no FN current is generated. Therefore, no electron is extracted from the floating gate 24, and the threshold value is maintained at the specified value or higher (3 V or higher), i.e., the initial value data 0 is maintained.

READ OPERATION

The read operation is executed by applying a specified positive voltage (3 V, for example) to the control gate 25 of the memory cell transistor and a specified positive voltage (1 V, for example) to the drain 23, with the source 22 and the substrate 21 grounded, and detecting a drain current flowing in this stage.

Referring now to FIG. 1, reference symbols BK1, BK2, . . . denote memory cell array blocks each including a memory cell array constructed by arranging in a matrix form memory cell transistors MT each having the construction shown in FIG. 2, word lines WL (WL11, . . . , WL18, WL21, WL28, . . . ) each connecting with the control gates of the memory cell transistors of an identical row, and bit lines BL (BL1, BL2, . . . , BLn) each connecting with the drains of the memory cell transistors of an identical column, each bit line being common to the plurality of blocks BK1, BK2, . . . Further, the sources of the memory cell transistors are connected all together to a common source line SL.

In the above nonvolatile semiconductor storage device, the erase operation is executed block by block. It is a matter of course that two or more blocks can be simultaneously erased. For example, when executing the erase operation on the block BK1, a specified negative voltage (−9 V, for example) is applied to the substrate and the common source line SL, while a specified positive voltage (10 V, for example) is applied to all the word lines WL11, . . . , WL18 of the block BK1. At this time, the bit lines BL are all placed in the floating state. Also, the word lines of the non-erased blocks BK2, . . . are all placed in the floating state, or made to have a specified negative voltage (−9 V, for example). As a result, the erase operation is executed on all the memory cell transistors of the block BK1. When simultaneously executing the erase operation on another block, for example the block BK2, the specified positive voltage is applied to all the word lines WL21, . . . , WL28 of the block BK2, too.

The write operation is executed word line by word line. For example, when writing data 1, 0, 1, . . . , 0 to the memory cell transistors MT111, 112, 113, . . . , 11n, respectively, connected with the word line WL11 of the block BK1, the substrate is grounded, the common source line SL is placed in the floating state, a specified negative voltage (−9 V, for example) is applied to the selected word line WL11 (at this time, the other nonselected word lines WL12, . . . are given, for example, the ground potential), and applied voltages for the bit lines are set to BL1=5 V, BL2=0 V, BL3=5 V, . . . , BLn=0 V. Thus, the above data are written to the memory cell transistors. The writing of data to the memory cell transistors connected to the other word lines is done in the same manner.

The read operation is executed by grounding the substrate and the common source line SL while applying a specified positive voltage (3 V, for example) to a word line WL connected with a memory cell transistor MT to be read and applying a specified voltage (1 V, for example) to a bit line BL connected with the memory cell transistor MT to be read, so that a drain current is detected.

In an external storage application aimed at replacing a magnetic recording medium by a flash memory, it is important to achieve an erase unit of about 512 bytes equivalent to that of the magnetic recording medium. To reduce the size of the erase unit to as small as about 512 bytes in the NOR-type flash memory shown in FIG. 1, it is necessary to divide the memory cell transistors into small blocks in a direction in which the bit lines are extended. However, when such a construction is adopted, a multiplicity of blocks will be arranged on an identical bit line. This increases a maximum cumulative time T of drain disturbs from which one memory cell transistor suffers in a write operation (T=write time of a single cell×(number of blocks−1)×number of word lines in one block×number of rewrite assurance times (up to $10^5$ times)) in proportion to the increase in number of blocks. Therefore, in order to realize a small size of the erase unit, it is necessary to remarkably improve a drain disturb tolerance of a non-selected cell in the write operation (i.e., a tolerance for the cumulative stresses placed on the non-selected cell due to the writing to the other cells connected to the identical bit line), in comparison with the regular flash memory having a large erase unit. This is because, if a sufficient tolerance for the drain disturbs is not provided, the stored data will be destroyed by the drain disturbs.

In order to solve such a technical problem, there has been proposed a DINOR (DIvided bit-line NOR) type flash memory in which the bit lines have a hierarchical structure with the provision of select gates between memory cell array blocks (H. ONODA et al., "A NOVEL CELL STRUCTURE SUITABLE FOR A 3 VOLT OPERATION, SECTOR ERASE FLASH MEMORY", IEDM, 1992).

The construction of the DINOR type flash memory is shown in FIG. 3.

This flash memory differs from the regular flash memory shown in FIG. 1 in that the bit lines of the former have a hierarchical structure constructed of sub-bit lines BL11, BL12, . . . , BL1n (block BK1), BL21, BL22, . . . , BL2n (block BK2), . . . provided for each block and main bit lines BLm1, BLm2, . . . , BLmn provided commonly to all the blocks, and in that select transistors ST (ST11, . . . , ST1n; ST21, . . . , ST2n, . . . ) are inserted between the sub-bit lines BL in each block and the main bit lines BLm. For example, when writing to the block BK1, an turn-on voltage is applied only to the gates of the select transistors ST11, ST1n between the main bit lines BLm1, . . . , BLmn and the sub-bit lines BL11, . . . , BLn of the block BK1, and a turn-off voltage is applied to the gates of the other select transistors. Further, with the substrate grounded and the common source line SL placed in the floating state, a specified negative voltage is applied to a selected word line and specified write voltages are applied to the respective main bit lines BLm. By this operation, the write operation is executed on the memory cell transistors located on the selected word line of the selected block.

FIG. 4 shows a cross sectional view taken along the bit line direction of the DINOR type flash memory shown in FIG. 3. Note that hatching for some parts is omitted from the figure for the sake of simplicity of the drawing. In the figure, reference numeral 51 denotes a p-type Si substrate, reference numeral 52 denotes a p-type well 52, and reference numeral 53 denotes a memory cell transistor which includes a source 531, a drain 531, a floating gate (a first polysilicon layer) 532, and a control gate (a second polysilicon layer) 533. Also, reference numeral 54 denotes a select transistor including a source 541, a drain 541 and a gate (the first polysilicon layer) 542, reference numeral 55 denotes a sub-bit line (a third polysilicon layer), reference numeral 56 denotes a main bit line (a first metal layer), and reference numeral 57 denotes a second metal layer wiring constituting a main word line connected with the word lines (sub-word lines) of the blocks.

According to this construction, in the write operation to a certain block, no write voltage is applied to the sub-bit lines, or drains, of the memory cell transistors of the other blocks. Therefore, the drain disturb to a certain cell in the write operation is remarkably reduced. Concretely speaking on the basis of the arrangement shown in FIG. 3 and FIG. 4, the drain disturb time for a certain cell on a sub-bit line in a block decreases to only a time which it takes to write to the other seven cells on the same sub-bit line in the block.

As described above, in this DINOR type flash memory, the select transistors are provided between the blocks so that the write voltage is applied only to the bit lines of a selected block at the write time. Therefore, there is an advantage that the cumulative time of the drain disturbs of each memory cell transistor is remarkably reduced. However, the additional provision of the select transistors increases the chip area of the flash memory. In addition, use of the third polysilicon layer as the wiring layer leads to an increase of the process steps for fabricating the memory, consequently increasing the chip cost.

The Japanese Patent Laid-open Publication No. HEI 8-153396 discloses another DINOR type flash memory wherein in a write stage, a negative voltage is applied to a substrate and a positive voltage is applied to non-selected word lines to reduce the drain disturbs in the write stage.

In this prior art DINOR type flash memory, however, because the negative voltage is applied to the whole substrate in the write stage, the negative voltage is applied even to a substrate portion having a selected block of memory cell transistors including those to be subjected to a write operation. In this case, therefore, there is a problem that the memory cell transistors in the selected block suffer an increased gate disturb.

SUMMARY OF THE INVENTION

The present invention has been developed with a view to solving the aforementioned conventional problems and has an object to provide a nonvolatile semiconductor storage device (a flash memory) which can reduce the drain disturb in a non-selected block and the gate disturb in a selected block in the write stage and which can suppress the increase in manufacturing cost as much as possible.

In order to accomplish the above object, the present invention provides a nonvolatile semiconductor storage device, comprising:

a substrate;

a plurality of wells which are formed on the substrate and isolated from each other, potentials of the respective wells being controllable independently from each other;

a plurality of blocks of memory cell transistors which are formed on the respective isolated wells, wherein the memory cell transistors in each block are arranged in a matrix form, and each memory cell transistor has a source, a drain, a floating gate and a control gate;

a plurality of bit lines each of which extends through the plurality of blocks and is connected with the drains of the memory cell transistors of an identical column in each block; and a plurality of word lines each of which is connected with the control gates of the memory cell transistors of an identical row.

With this arrangement, because the wells for the respective blocks of memory cell transistors are isolated from each other, the well potential of a non-selected block can be controlled independently of the well potential of a selected block. Accordingly, it is possible to apply a bias voltage for increasing a threshold voltage of the memory cell transistors only to the wells of the non-selected blocks while setting the well of the selected block at, typically, a ground potential in the write stage. Therefore, it is possible to reduce the drain disturb in non-selected blocks without raising the problem of the increased gate disturb in the selected block, inherent to the second prior art DINOR flash memory.

The present invention uses no select transistors as provided in the first prior art DINOR flash memory. Therefore, the chip planar dimensions and manufacturing cost can be reduced, as compared with this prior art memory.

In an embodiment, in a write stage, a predetermined write-stage well voltage is applied to the well of a selected block including the memory cell transistors to be subjected to a write operation, a bias voltage is applied to the well of each of the remaining, non-selected blocks to increase a threshold voltage of the memory cell transistors of each non-selected block, in comparison with a threshold voltage determined by the predetermined write-stage well voltage, and a voltage is applied to the control gates of the memory cell transistors of each non-selected block to reduce a difference between a potential of the floating gate of each memory cell transistor of each non-selected block and a write-stage drain voltage applied to the drain of the memory cell transistor through the associated common bit line such that a source-drain leak current of each memory cell transistor in the non-selected blocks falls in a permissible range.

Preferably, the bias voltage to be applied to the well of each non-selected block and the voltage to be applied to the control gate of each memory cell transistor of each non-selected block are set to respective values which make a value of the source-drain leak current of each memory cell transistor of each non-selected block smaller than a value of a source-drain leak current occurring when the well and the control gate are grounded.

In the case of an n-channel transistor, the above bias voltage is a negative voltage of, for example, −2 V, and the voltage to be applied to the control gate is a positive voltage of, for example, 1 V.

In order to reduce the drain disturbs in the write stage, it is preferable to adjust the voltage of the control gates of the memory cell transistors of the non-selected blocks for the control of the potential of the floating gates of those transistors utilizing a capacitive coupling, so as to minimize a difference between the potential of the floating gates and a write-stage drain voltage applied to the drains of the memory cell transistors of the non-selected blocks via the associated bit lines such that the electric field between the drain and the floating gate is weakened. For example, in the case of the memory cell transistor shown in FIG. 2, it is proper to apply a positive voltage of about 2 V. However, with such a control only, a source-drain leak current occurring in memory cell transistors included in the non-selected block (in particular, transistors in which data of a value one "1" is written) will increase. Then, via the transistor or transistors in which the current leak occurs and a common source line, a current leak occurs from a bit line to which a high-potential write voltage (4 V, for example) is applied, to a bit line to which a low-potential write voltage (0 V, for example) is applied. Due to the current leak, the potential of the high-potential bit line does not rise, which in turn causes a problem that much time is required for the write operation or a problem that the write operation cannot be executed. In light of the above, according to the embodiment of the present invention, the control of the well potential of the non-selected block only (for this control, each block is formed on an independent well) is combined with the control of the control gate voltage of the memory cell transistors of the non-selected block. The combined control of the well potential and the control gate voltage for the non-selected blocks increases the threshold value of the memory cell transistors of only the non-selected block by virtue of a back gate bias effect to hinder a leak current from occurring. This arrangement enables a more desirable control gate voltage application with regard to the reduction of drain disturbs.

In an embodiment, each memory cell transistor is configured such that erase and write operations are executed by injecting electrons into the floating gate and extracting electrons from the floating gate by an FN current, respectively.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

An embodiment of the present invention will be described in detail below with reference to FIGS. 5–8 in which parts identical or similar to those shown in FIGS. 1–4 are denoted by the same or like reference symbols.

Figure 5:
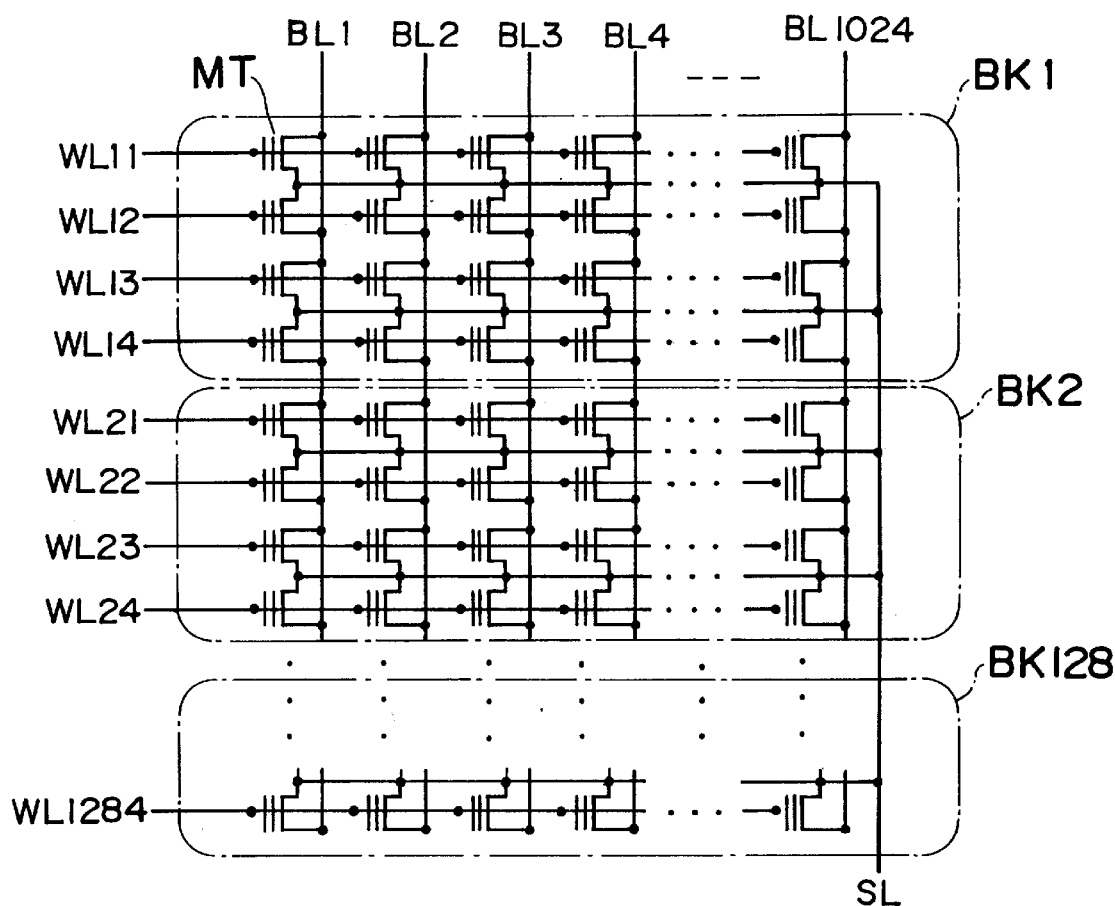
FIG. 5 is a diagram of the circuit construction of a flash memory according to an embodiment of the present invention.

FIG. 5 is a diagram of the circuit construction of a flash memory according to an embodiment of the present invention. The capacity of one block, an erase unit, is 512 bytes in the present embodiment, although the capacity of one block constituting the erase unit can be set as desired. As shown in FIG. 5, the present flash memory has a construction identical to that of the prior art flash memory shown in FIG. 1 in terms of circuit diagram.

Figure 2:
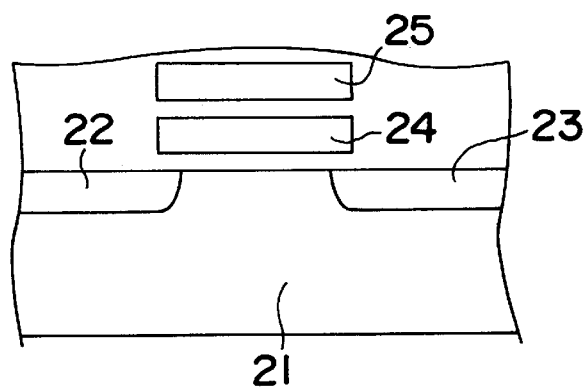
FIG. 2 is a sectional view showing the structure of one of memory cell transistors constituting the nonvolatile semiconductor storage device shown in FIG. 1.
Figure 3:
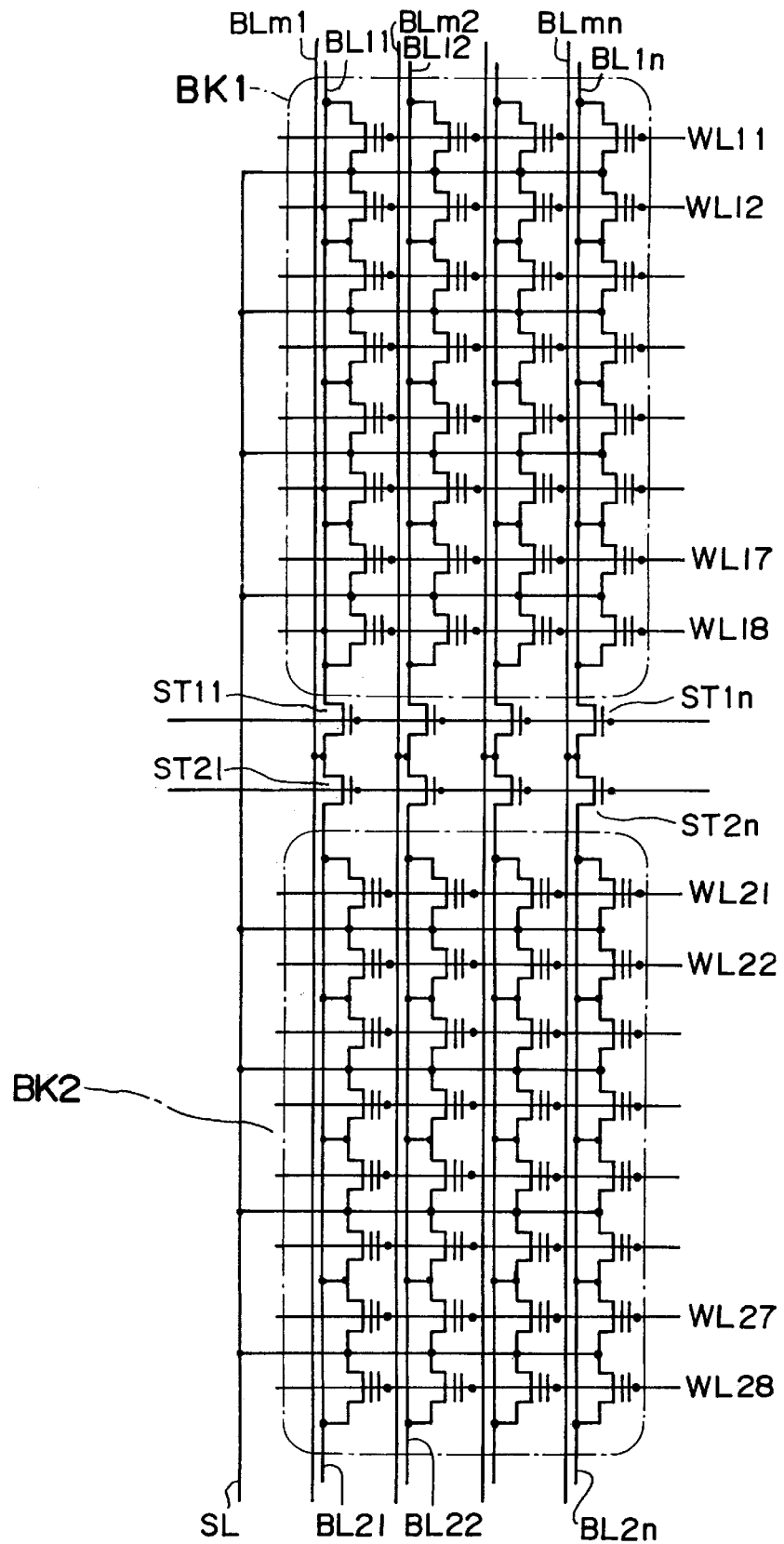
FIG. 3 is a diagram of the circuit construction of a prior art DINOR type flash memory.
Figure 4:
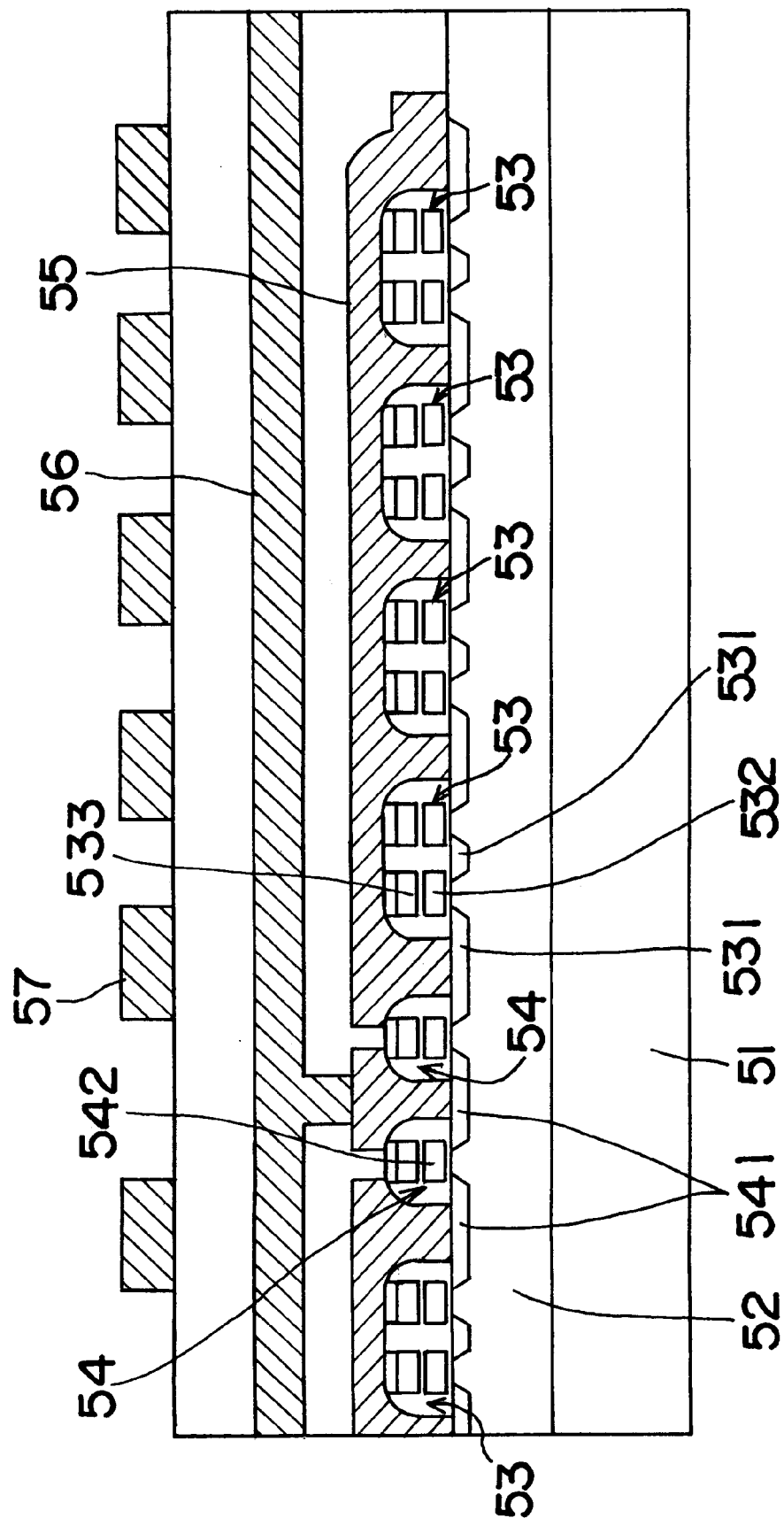
FIG. 4 is a sectional view in the bit line direction of the DINOR type flash memory shown in FIG. 3.

In the figure, reference symbols BK1, BK2, . . . , BK128 denote memory cell array blocks (or sectors) each including a memory cell array constructed by arranging in a matrix form memory cell transistors MT having the same structure as that of the prior art memory cell transistor shown in FIG. 2. Each memory cell array block also includes word lines WL11, . . . , WL14, WL21, . . . , WL24, . . . , WL1284 each connecting with the control gates of the memory cell transistors MT of an identical row, and bit lines BL1, BL2, . . . , BL1024 each connecting with the drains of memory cell transistors MT of an identical column. The bit lines BL1, BL2, . . . , BL1024 are common to the plurality of blocks BK1, BK2, . . . , BK128. The sources of all the memory cell transistors MT are connected together and connected to a common source line SL. The number of memory cell transistors included in each block is 1024×4=4096, meaning that the capacity of each block is 512 bytes (4096 bits). It is to be noted that the number of blocks in the bit line direction, the memory capacity of each block, the number of word lines and the number of bit lines are not limited to the above-specified numerical values in the present embodiment, and they are each allowed to have an arbitrary value.

Figure 6:
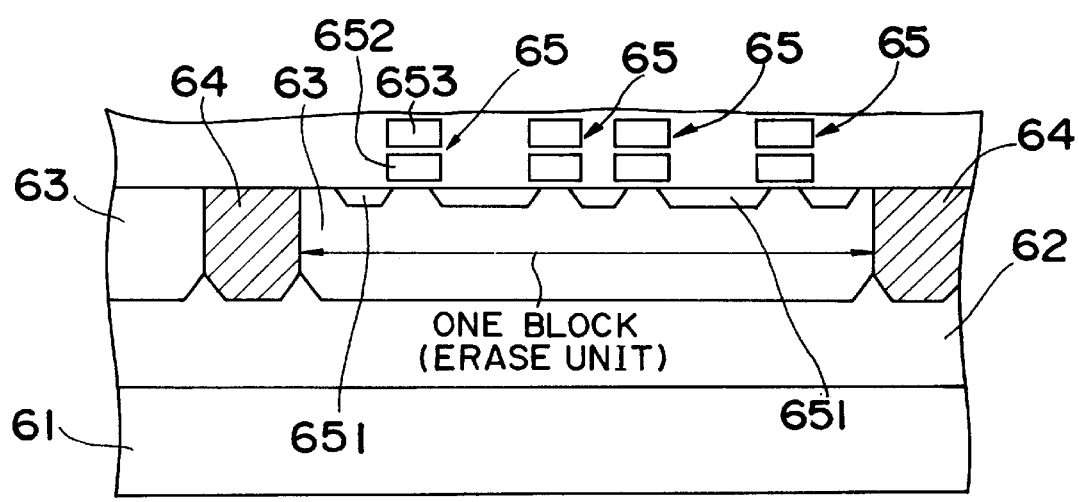
FIG. 6 is a sectional view in the bit line direction of the flash memory shown in FIG. 5.

Characteristic features of the present embodiment are shown in FIG. 6 which is a sectional view taken along the bit line direction of FIG. 5.

In the figure, reference numeral 61 denotes a p-type Si substrate and reference numeral 62 denotes an n-type well (a deep well). Reference numeral 63 denotes each of p⁻-type wells (only two of which are shown) formed on the n-type well 62. On the p⁻-type wells 63 are formed memory cell transistors 65 of each memory cell array block. Each memory cell transistor 65 has a source 651, a drain 651, a floating gate 652 and a control gate 653. Reference numeral 64 denotes each of n-type wells for isolating the p⁻-type wells 63 from each other. Some of the constituent parts, such as the bit lines, are not shown in FIG. 6 for the sake of simplicity. It is a structural feature of the present invention that the memory cell arrays of each block are formed on the respective independent or isolated wells, as shown in FIG. 6.

The flash memory is fabricated by the following process.

The n-type well 62 is formed on the p-type Si substrate 61 by epitaxial growth or impurity ion implantation. Next, a p⁻-type well is formed on the entire wafer surface by epitaxial growth or impurity ion implantation. Thereafter, to separate the p⁻-type well into a plurality of p⁻-type wells 63, an n-type impurity ions are implanted into predetermined portions, thereby forming the n-type wells 64, . . . serving as isolators. The isolation width of each n-type well 64 is able to be made equal to or smaller than the spacing between blocks in the FIGS. 3 and 4 prior art where the select gates are provided. Therefore, the chip area can be reduced in comparison with the prior art (DINOR type). Next, memory cell transistors each having a floating gate are formed through ordinary fabrication process steps. Subsequently, bit lines and the other constituent parts are formed by process steps similar to those of the prior art. As a result, a final flash memory structure is obtained. The bit lines are formed of a single layer of polysilicon. Therefore, the increase in number of the manufacturing process steps, which was the problem of the prior art DINOR type flash memory, is also eliminated.

Alternatively, the p⁻-type wells 63 and the isolating n-type wells 64 may be formed by the following method. That is, after forming the n-type well 62, selective ion implantation of a p-type impurity using a mask is performed to form the p⁻-type wells 63, . . . Thereafter, selective ion implantation of an n-type impurity using another mask is performed to form the n-type wells 64, . . . It is to be noted that the selective ion implantation of the n-type impurity is not necessary if the n-type well 62 has an impurity concentration sufficient for the isolation purposes.

Figure 1:
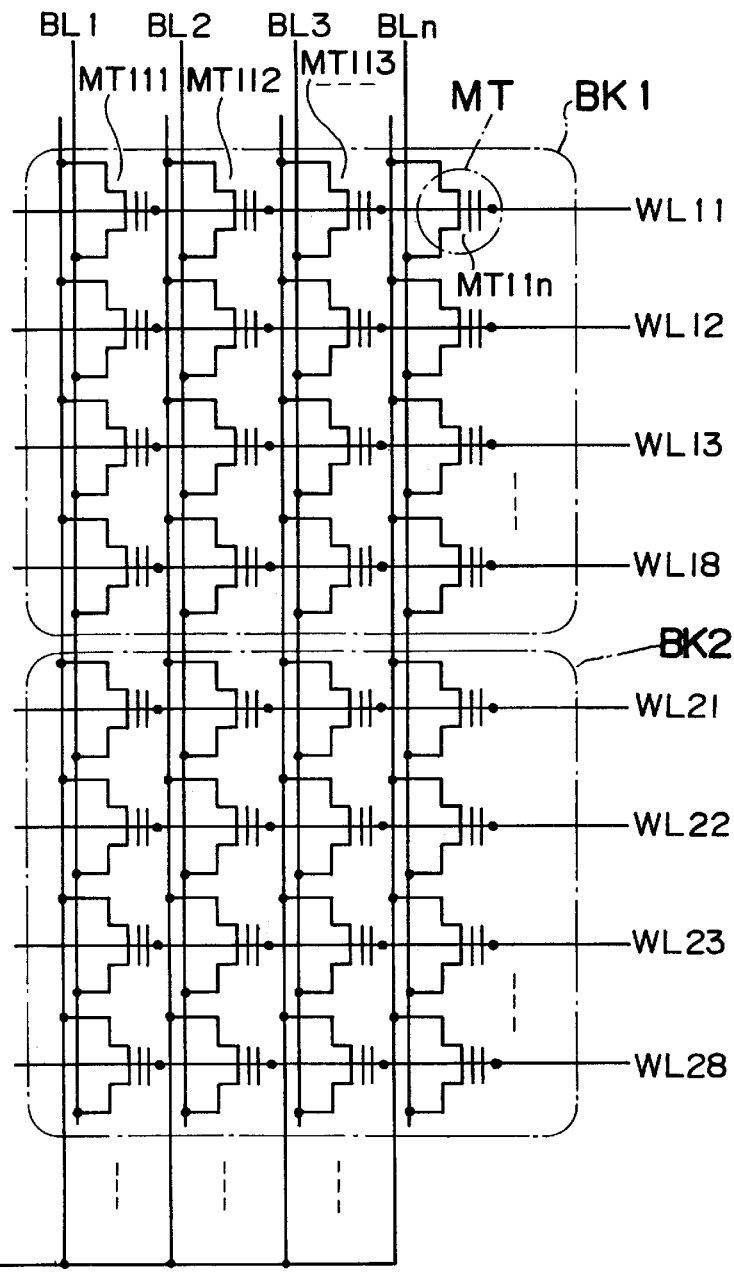
FIG. 1 is a diagram of the circuit construction of a prior art nonvolatile semiconductor storage device.

In the present embodiment, the maximum value T of the cumulative time of drain disturbs which a single cell suffers in the write stage is same as that of the prior art flash memory shown in FIG. 1, and it is calculated from the formula of write time of a single cell×(number of blocks−1)×number of word lines in one block×number of rewrite assurance times. The value T is, for example, 1 msec×127×4×10⁵=5.08×10⁴ sec. The tolerance for the drain disturbs, however, is improved by virtue of the reduction in magnitude of each drain disturb.

The drain disturb increases in proportion to the magnitude of the electric field between the floating gate and the drain. Therefore, by applying a positive voltage (2 V, for example) to the word lines of the non-selected blocks to thereby increase the potential at the floating gate by the capacitive coupling, the electric field between the floating gate and the drain is reduced, and the drain disturb is reduced accordingly. However, the increase in potential of the floating gate will cause a leak current between the source and the drain of each memory cell transistor of the non-selected blocks, and a large current will flow between a high-potential bit line and a low-potential bit line. As a result, the drain voltage of the memory cell transistor of the selected block hardly increases. This leads to a problem that the write operation for the selected block requires a long time or a problem that the write operation itself cannot be executed.

In light of the above, in the present invention, a specified negative voltage (−2 V, for example) is further applied to the well of the non-selected block to increase the threshold value of the memory cell transistors of the non-selected blocks, thereby allowing the leak current of the memory cell transistor to be suppressed even when the potential of the floating gate is made high. With this arrangement, the drain disturb is reduced without deteriorating the write characteristics. It is to be noted that the ground potential, or the normal write-stage well voltage, is applied to the well of the selected block which contains the cells to be subjected to a write operation.

The value of the back gate bias voltage to be applied to the p-type well 63 of the non-selected block and the value of the positive voltage to be applied to the word line WL of the non-selected block are set such that a value of a leak current flowing through the memory cell transistor of the non-selected block is smaller than a value of a leak current which will flow between the source and the drain of the same memory cell transistor when the p-type well 63 and the word line WL are each grounded.

Figure 7:
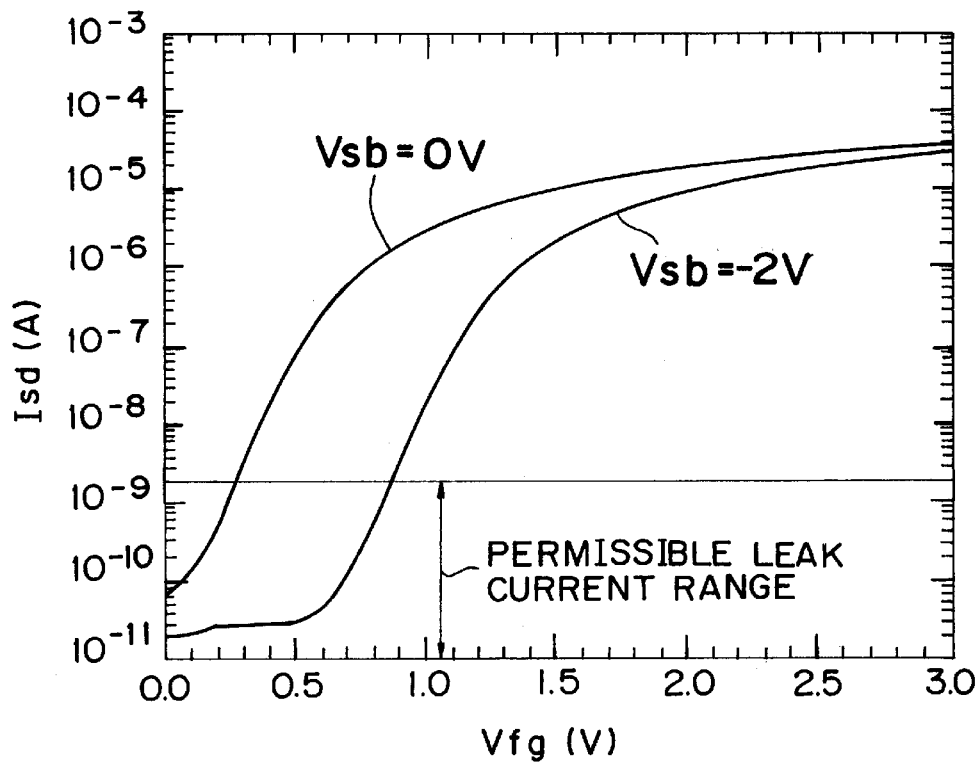
FIG. 7 is a graph showing Isd (source-drain current) to Vfg (floating gate potential) characteristics of an evaluation memory cell transistor having a floating gate connected with a lead, in the case where a well potential (Vsb) is Vsb=0 V and in the case where Vsb=−2 V.

FIG. 7 shows Isd (a source-drain current) to Vfg (a floating gate potential) characteristics in the case where the well potential (Vsb) is Vsb=0 V and in the case where Vsb=−2 V in a memory cell transistor for evaluation use of which the floating gate is in contact with a lead. Upon applying the negative voltage to the p-well of the memory cell transistor, a value of Vt,fg (a threshold value) of the memory cell transistor is increased by virtue of the back gate bias effect, and the Isd-Vfg characteristic curve of the memory cell transistor shifts to the right in the graph. Thus, an upper limit of Vfg at which Isd falls in a permissible range of the source-drain leak current per memory cell transistor, increases from 0.25 V to 0.85 V. If Vsb=−2 V and a write drain voltage Vd=4.5 V are applied to the memory cell transistor in a state in which the floating gate stores no electron (Q=0), then Vcg (a control gate voltage, i.e., a word line potential) satisfying an expression Vfg ≦0.85 V is obtained from the following capacitive coupling equation:

$$Vfg = GCR \times Vcg + DCR \times Vd + SCR \times Vs + SBCR \times Vsb$$

where GCR is a gate coupling ratio,
DCR is a drain coupling ratio,
SCR is a source coupling ratio, and
SBCR is a well coupling ratio.

Typically, the coupling ratios are set to the values of GCR=0.59, DCR=0.11, SCR=0.16, SBCR=0.12. Using these values, Vcg becomes Vcg≦1.0 V.

Therefore, by applying Vsb=−2 V to the p-well of the non-selected block and applying Vcg=1 V to each word line of the non-selected block, the leak current between the source and the drain of each memory cell transistor in the non-selected block is suppressed to fall within the permissible range of the leak current, thereby allowing the drain disturb tolerance to be improved without deteriorating the write characteristic.

Figure 8:
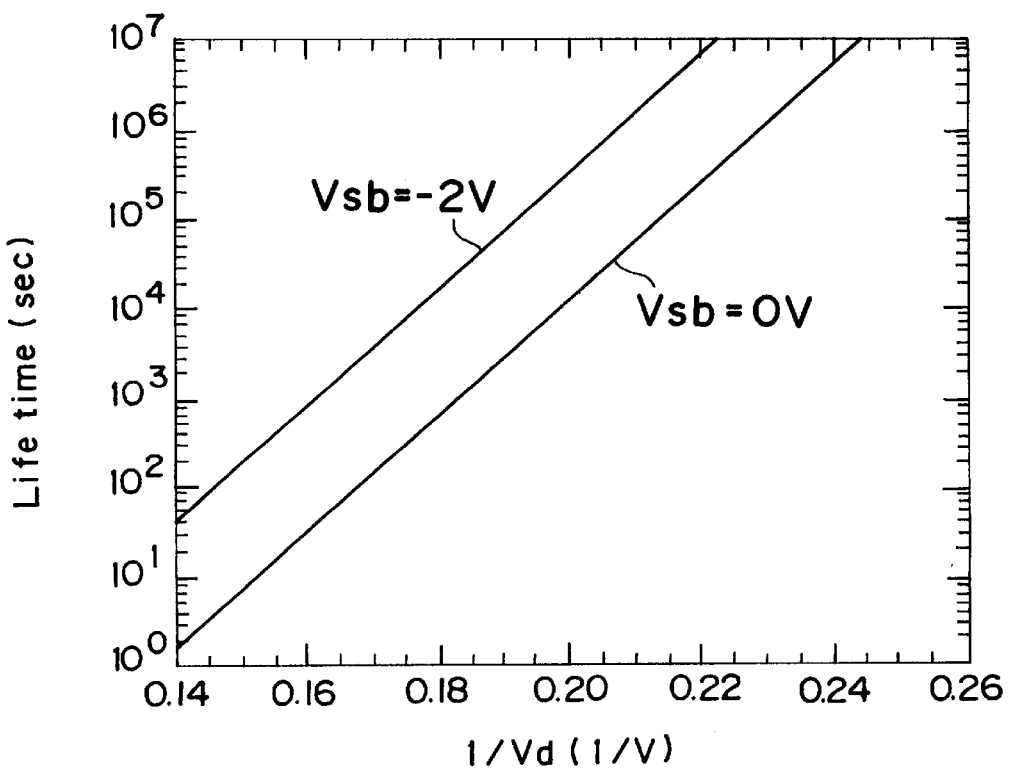
FIG. 8 is a graph showing a relationship between a drain disturb voltage Vd of a memory cell transistor and a device life time in the case where the well potential Vsb=−2 V and a word line potential Vcg=1 V and in the conventional case where the well potential Vsb=0 V and the word line potential Vcg=0 V.

FIG. 8 is a graph showing a relationship between a drain disturb voltage Vd and a device life time in the present case where the well potential Vsb=−2 V and a word line potential Vcg=1 V and in the conventional case where the well potential Vsb=0 V and the word line potential Vcg=0 V. In the present case, since the potential of the floating gate can be increased by applying Vcg=1 V, the electric field between the drain and the floating gate can be reduced. Therefore, as shown in FIG. 8, the device life time in the case of Vsb=−2 V and Vcg=1 V was increased by one order of magnitude, as compared with the conventional case of Vsb=0 V and Vcg=0 V, and was more than ten times as long.

As obvious from the above, the present invention provides a very useful nonvolatile semiconductor storage device capable of remarkably improving the drain disturb tolerance while suppressing the increase in chip area and manufacturing cost.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor storage device, comprising:

a substrate;

a plurality of wells of a first type which are formed on said substrate and isolated from each other by a plurality of isolated wells of a second type which are also formed on said substrate, potentials of each of the plurality of wells of the first type being controllable independently from the other;

a plurality of blocks of memory cell transistors which are formed on the plurality of isolated wells of the second type, respectively, wherein said memory cell transistors in each block are arranged in a matrix form, and each memory cell transistor has a source, a drain, a floating gate and a control gate;

a plurality of bit lines each of which extends through said plurality of blocks and is connected with the drains of the memory cell transistors of an identical column in each block; and a plurality of word lines each of which is connected with the control gates of the memory cell transistors of an identical row.

2. A nonvolatile semiconductor storage device, comprising:

a substrate;

a plurality of wells of a first type which are formed on said substrate and isolated from each other by a plurality of isolated wells of a second type which are also formed on said substrate, potentials of each of the plurality of wells of the first type being controllable independently from the other;

a plurality of blocks of memory cell transistors which are formed on the plurality of isolated wells of the second type, respectively, wherein said memory cell transistors in each block are arranged in a matrix form, and each memory cell transistor has a source, a drain, a floating gate and a control gate;

a plurality of bit lines each of which extends through said plurality of blocks and is connected with the drains of the memory cell transistors of an identical column in each block;

a plurality of word lines each of which is connected with the control gates of the memory cell transistors of an identical row;

a predetermined write-stage well voltage which is applied to the well of a selected block of the memory cell transistors to be subjected to a write operation;

a bias voltage which is applied to the well of each of the remaining, non-selected blocks of the memory cell transistors to increase a threshold voltage of the memory cell transistors of each non-selected block, in comparison with a threshold voltage determined by the predetermined write-stage well voltage; and a voltage which is applied to the control gates of the memory cell transistors of each non-selected block to reduce a difference between a potential of the floating gate of each memory cell transistor of each non-selected block and a write-stage drain voltage applied to the drain of the memory cell transistor through the associated common bit line such that a source-drain leak current of each memory cell transistor in the non-selected blocks falls in a permissible range.

3. The nonvolatile semiconductor storage device as claimed in claim 1, wherein each memory cell transistor is configured such that erase and write operations are executed by injecting electrons into the floating gate and extracting electrons from the floating gate by an FN current, respectively.

4. The nonvolatile semiconductor storage device as claimed in claim 2, wherein said bias voltage to be applied to the well of each non-selected block and said voltage to be applied to the control gate of each memory cell transistor of each non-selected block are set to respective values which make a value of the source-drain leak current of each memory cell transistor of each non-selected block smaller than a value of a source-drain leak current occurring when the well and the control gate are grounded.

* * * * *